United States Patent [19]

Nishizawa et al.

[11] Patent Number: 4,565,156
[45] Date of Patent: Jan. 21, 1986

[54] APPARATUS FOR PERFORMING SOLUTION GROWTH RELYING ON TEMPERATURE DIFFERENCE TECHNIQUE

[75] Inventors: Jun-ichi Nishizawa; Yasuo Okuno, both of Sendai, Japan

[73] Assignee: Zaidan Hojin Handotai Kenkyu Shinkokai, Sendai, Japan

[21] Appl. No.: 470,541

[22] Filed: Feb. 28, 1983

[30] Foreign Application Priority Data

Mar. 1, 1982 [JP] Japan ................................. 57-32750

[51] Int. Cl.[4] .......................................... H01L 21/208
[52] U.S. Cl. ..................... 118/412; 118/415; 118/425
[58] Field of Search ............... 118/415, 412, 421, 425; 156/620, 621, 622; 148/171, 172

[56] References Cited

U.S. PATENT DOCUMENTS

| 3,648,654 | 3/1972 | Bergh | 118/429 |
| 3,839,991 | 10/1974 | Winstel et al. | 118/620 |
| 4,026,735 | 5/1977 | Kamath et al. | 148/171 |
| 4,315,796 | 2/1982 | Nishizawa | 156/614 |
| 4,347,097 | 8/1982 | Nishizawa | 156/622 |
| 4,359,012 | 11/1982 | Nishizawa | 118/59 |
| 4,401,487 | 8/1983 | Lockwood | 148/171 |

FOREIGN PATENT DOCUMENTS

1451379 12/1973 United Kingdom .

OTHER PUBLICATIONS

Western Electric, "Method for Reducing LPE-Edge Growth", by D. L. Rode, Technical Digest, No. 46, Apr. 1977, pp. 29 and 30.

Jun-ichi Nishizawa et al, Liquid Phase Epitaxy of GaP by a Temperature Difference Method Under Controlled Vapor Pressure, IEEE Transactions on Electron Devices, vol. ED-22, No. 9, Sep. 1975, pp. 716 to 721.

J. Nishizawa et al, Nearly Perfect Crystal Growth of III-V Compounds by the Temperature . . . , Journal of Crystal Growth 31, 1975, pp. 215 to 222.

Primary Examiner—John D. Smith
Assistant Examiner—Kenneth Jaconetty
Attorney, Agent, or Firm—Cushman, Darby & Cushman

[57] ABSTRACT

A solution growth apparatus for conducting an epitaxial growth of a compound semiconductor crystal from solution by relying on the temperature difference technique at a constant growth temperature and on a mass production scale without deranging the control of the growth temperature applied externally of the growth apparatus and with the application of only a small heating power and only a small cooling power, by enhancing the thermal exchange efficiency through the provision of heating means, via an insulator, for the melt-containing reservoir provided on the growth boat housed within a quartz reactor and by the provision of cooling means at the bottom of the boat within the reactor.

10 Claims, 13 Drawing Figures

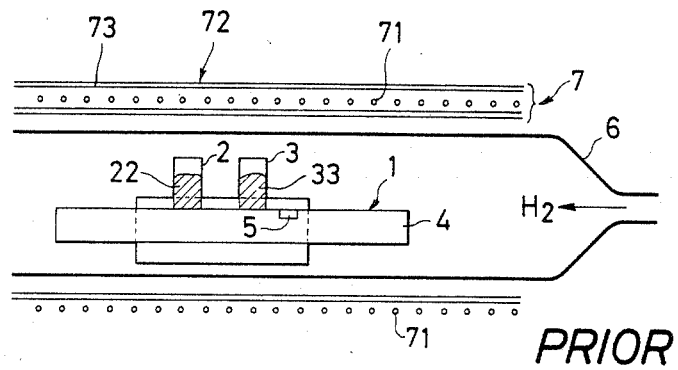 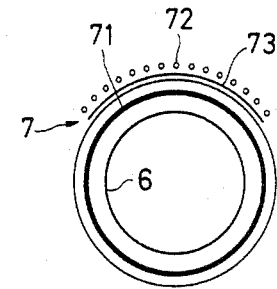
PRIOR ART
FIG. 1A          FIG. 1B
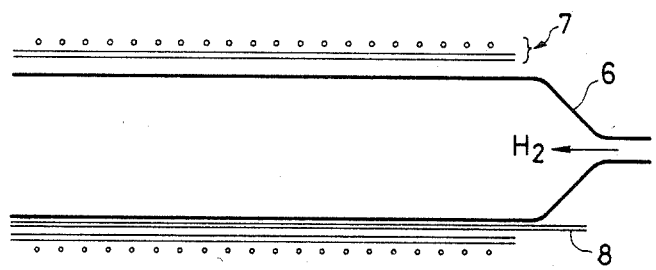 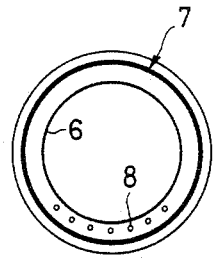
PRIOR ART
FIG. 2A          FIG. 2B

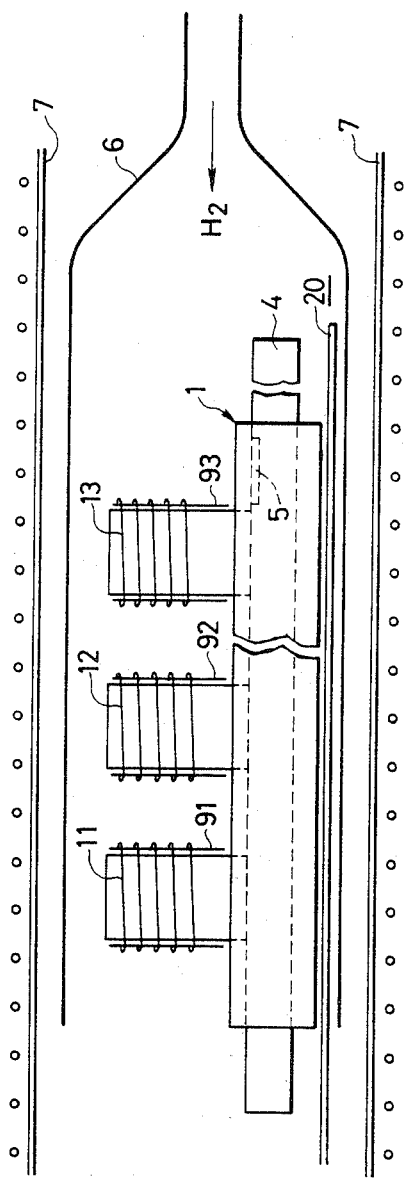
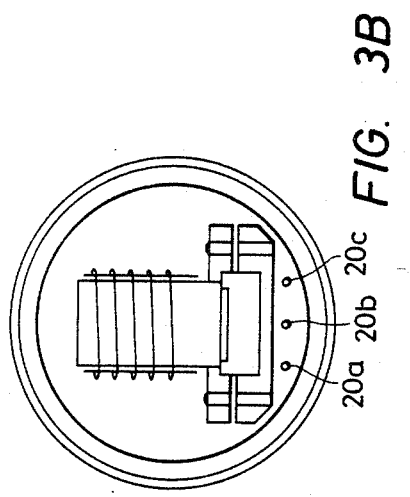
FIG. 3A
FIG. 3B

APPARATUS FOR PERFORMING SOLUTION GROWTH RELYING ON TEMPERATURE DIFFERENCE TECHNIQUE

BACKGROUND OF THE INVENTION

1. Field of the invention

The present invention relates to an apparatus for performing epitaxial growth of a compound semiconductor crystal from liquid phase (hereinafter to be referred to as "solution growth"), and more particularly it pertains to an apparatus for performing a solution growth of a compound semiconductor crystal relying on the temperature difference technique.

2. Description of the prior art

Group III–V compound semiconductor crystals as represented typically by GaAs, and Group II–VI compound semiconductor crystals known typically by, for example, ZnS are being used widely as the materials for manufacturing various semiconductor devices such as laser diodes (LDs) and light-emitting diodes (LEDs).

Compound semiconductor crystals which are used in these semiconductor devices are obtained usually through epitaxial growth in liquid phase, i.e. through solution growth.

The method for performing such solution growth of compound semiconductor crystals which has been introduced in this field of technology in the past and is widely known was developed by RCA Corporation of U.S.A. and is known as "Nelson method".

This known method uses a solution of a certain metal serving as a solvent in which a desired compound semiconductor material is dissolved up to the saturated condition, which will hereinafter be referred to simply as a "melt", and in the state of this melt that a predetermined compound semiconductor crystal which will serve as a substrate is in contact therewith, the melt is cooled down slowly, so that, owing to the lowering of the temperature of the melt, the supersaturated compound semiconductor material is epitaxially grown as a crystal on the substrate.

In this known method, the growth of crystal proceeds during a cooling process, and accordingly there is performed only one growth of crystal for one process of growth. Thus, this known method is not available for mass production of crystal. Furthermore, when the layer which is grown according to this method is viewed in the direction of its thickness, there develops difference in the amount of the content of the impurity at various sites of this grown layer owing to the difference in the temperature of the growth occurring at these various sites. Thus, in the growth of a mixed crystal, the composition of the crystal will exhibit variance in the direction of the thickness of the grown layer. Also, it has been made clear that imperfection of crystal is induced also owing to the changes in temperature during the growth. In spite of these various drawbacks of this known method, a crystal growth can be effected with a relative easiness, and therefore, this Nelson method is being widely employed in this field of technology.

SUMMARY OF THE INVENTION

A method which is capable of eliminating all of the abovesaid drawbacks has already been invented, in a style permitting a mass production, by Jun-ichi NISHIZAWA, one of the co-inventors of the present invention, see U.S. Pat. No. 4,347,097 issued Aug. 31, 1982. This earlier method may be called the "temperature difference method" which is such that a temperature difference is established between the melt and the substrate which contacts this melt, and that owing to the thermal diffusion as well as the atomic diffusion due to solute concentration gradient in line with the temperature gradient due to said temperature difference, a predetermined source crystal which is the compound semiconductor material disposed, in contact with the melt, on the higher temperature side of the reservoir containing the melt is caused to dissolve into the melt, and that the atoms of the compound semiconductor material which have travelled or have been transported through the melt which is the solvent recrystallize to form a growth layer on the substrate which is arranged on the lower temperature side of the melt contacting the substrate. As the resulting layer has gained a required thickness, it is only necessary to remove the substrate from the melt. This method permits the solution growth at a constant temperature, so that it is a growth method which is by far the superior to said Nelson method. Accordingly, this Nishizawa method has now become the leading technical preference in this particular field of science.

Thus, the essential important principles or conditions which are required of the solution growth apparatus intended for performing a solution growth adopting the temperature difference technique are:

(1) a temperature difference is established, throughout the growth period, within the melt which is used in the solution growth of crystal;
(2) a thermal flow exists through the substrate; and
(3) a constant growth temperature is maintained throughout the growth process.

However, in the conventional solution growth apparatus relying on this temperature difference technique, the most important condition (3) mentioned above has been neglected, and an importance has been placed on the condition (1). Therefore, discussion will be made first hereunder of some typical examples of conventional solution growth apparatus structure intended for providing a temperature difference and also of the problems accruing therefrom.

(I). Example of a conventional solution growth apparatus structure adopting the system of establishing a temperature difference by the provision of an auxiliary heating means exteriorly of a quartz tube serving as the reactor tube.

This structural example is shown in FIG. 1A and FIG. 1B, in which FIG. 1A is a longitudinal sectional side elevation, and FIG. 1B is a cross sectional view of the apparatus. At appropriate sites within a boat 1 intended for the solution growth, there are disposed melt reservoirs 2 and 3 which contain, in their respective upper portions, a melt 22 and a melt 33 both containing a source crystal. In order to meet the instance where two layers are to be grown, a substrate crystal 5 is supported on a slider 4 which is allowed to slide horizontally on the boat 1. As this slider 4 moves sideways, the substrate 5 is brought into contact, for a required length of time, with the melt 22 and the melt 33 in succession, and thus there can be grown two layers, in required thicknesses, one upon another on the substrate 5. This boat 1 is placed within a reactor tube 6 made of quartz, and a temperature difference is established within the melt by a heating furnace 7 provided exteriorly of the reactor tube 6. The above is the outline of the solution growth apparatus of this conventional example intended for developing a temperature difference in the melt. As the atmosphere for the solution growth, such an inert gas as $H_2$, $N_2$ and Ar is used. In order to develop a temperature difference $\Delta T$, this growth furnace 7 includes, in addition to the main heating means 71, a sub-heating means 72 for holding only the upper portion of the furnace 7 at a high temperature, and this sub-heating means is wound around the furnace 7 via a thermal insulator 73 made of such substance as $Al_2O_3$ or it is provided to run in parallel with the longitudinal length of the furnace 7.

(II). Example of a conventional solution growth apparatus structure adopting the system of establishing a temperature difference by the provision of a cooling means exteriorly of the quartz reactor tube.

This structural example is shown in FIGS. 2A and 2B, wherein FIG. 2A is a longitudinal sectional side elevation, and FIG. 2B is a cross sectional view of this apparatus. A boat 1 is arranged in a quartz reactor tube 6 (the boat 1 is not shown since the arrangement is same as that shown in FIG. 1). The additional sub-heating means 72 is omitted in this example, and a heating furnace 7 provided with only a main heating means 71 is used. In order to impart a temperature difference, there is inserted, in the lower side of the apparatus between the growth furnace 7 and the reaction quartz tube 6, a cooling tube assembly 8 consisting of a plurality of quartz tubes or stainless steel tubes or nickel tubes. A coolant gas such as a compressed air or nitrogen gas is caused to flow through this assembly of pipes to cool the lower portion of the melt rather than the upper portion thereof, whereby to establish a temperature difference in the melt.

(III). Example of a conventional solution growth apparatus adopting the system of establishing a temperature difference by the combined use of the system of (I) and the system of (II) mentioned above. This structure is not shown, but it is the structure which is most widely utilized presently.

It should be noted, however, that each of the systems (I), (II) and (III) mentioned above performs a crystal growth by considerably sacrificing the advantage that a growth can be performed at a constant temperature which is the most essential and important feature of the temperature difference method. More specifically, the solution growth of crystal is performed on a boat which is arranged in a quartz reactor tube. However, the elevating or lowering the temperature exteriorly of the quartz reaction tube which is performed to develop a temperature difference in the melt supported on the boat makes one to readily expect a very low thermal efficiency. This poor thermal efficiency leads to a very large fluctuation of the growth temperature. More specifically, when the system (I) is followed, let us now consider the instance that a GaAs layer is to be grown in the solution growth apparatus which is arranged, for example, with a quartz reaction tube having a diameter of 700 mm and a length of 1500 mm. In order to obtain a growth rate of 5 μm/hr at the growth temperature of 750° C., there must be used a main heating means of 900 W and a subheating means of 250 W in capacity. Since the main heating means and the sub-heating means are arranged close to each other spatially, there arises a large interaction between these two heating means, so that it is difficult to effect a precise control so as to maintain a certain growth temperature at the surface of the substrate and also to hold a constant temperature difference in the melt. As a result, large temperature fluctuations are brought about during the growth, thus immensely imparing the advantage or merit peculiar to the temperature difference technique. In case the input applied to the sub-heating means is lowered below 100 W, no required temperature difference is developed, and accordingly, it will be readily inferred, from the fact that a growth has been hardly effected, that the thermal conduction efficiency is very low.

Similar discussion can be made also to the system (II). In order to obtain a growth rate which is substantially equal to that of the system (I), it is necessary to supply through the cooling pipe a large amount of cooling gas such as air in an amount as much as several 100 liters/min. This cooling will inevitably cause a lowering of the temperature of the entire growth furnace, and accordingly the power input applied to the main heating means will have to be increased. Thus, the making of a precise control of temperature will become very difficult in a way similar to that noted in the system (I), and concurrently therewith, there will be resulted a lowering of crystal perfection of the grown layer.

In the instance of the system (III) also, it is apparent that the essentials of the temperature difference technique are impared for the reasons mentioned above.

A further drawback of the conventional solution growth method relying on the temperature difference technique is that, because the respective batches of melt contained in the plurality of melt reservoirs are subjected to a same temperature difference, it will be noted that, in case of performing a continuous epitaxial solution growth of multiple layers having different thicknesses, there will arise the troublesome need to adjust the temperature difference for the respective reservoirs to secure a constant growth time for each of these melt reservoirs. It is, however, extremely difficult to arrange a growth system which permits mass production while satisfying said need to adjust the respective temperature differences in the respective reservoirs. In this regard, the conventional methods are quite inconvenient for such purpose.

It is, therefore, the object of the present invention to provide an apparatus for performing a solution growth which eliminates all of the above-mentioned drawbacks of the conventional solution growth systems using the temperature difference technique and which satisfies the above-mentioned condition (III) which is important in the temperature difference technique, and more practically, to provide an apparatus for continuously growing multiple layers epitaxially from liquid phase which is convenient for the purpose of mass production.

BRIEF DESCRIPTION OF THE DRAWINGS

FIGS. 1A and 1B are an example of a conventional solution growth apparatus relying on the temperature difference technique, which has a quartz reactor tube provided exteriorly with a sub-heating means in addition to a main heating means to develop a temperature difference in the melt supported on a boat, in which:

FIG. 1A is a longitudinal sectional view, and FIG. 1B is a cross sectional view.

FIGS. 2A and 2B are an example of another conventional solution growth apparatus adopting the temperature difference technique, having a cooling assembly provided exteriorly of a quartz reactor tube for the flow of a coolant gas, in which:

FIG. 2A is a longitudinal sectional view, and FIG. 2B is a cross sectional view.

FIGS. 3A and 3B are an embodiment of the solution growth apparatus of the present invention relying on the temperature difference technique and having the specific arrangement according to the present invention such that a sub-heating means and a cooling means are provided in the vicinity of a boat housed in a quartz reaction tube to develop a temperature difference in the batch or batches of melt supported on a boat, in which:

FIG. 3A is a longitudinal sectional view and FIG. 3B is a cross sectional view.

FIGS. 8A and 8B are an embodiment of the solution growth apparatus according to the present invention, consisting of a plurality of melt reservoirs each being provided with a sub-heating means, in which:

FIG. 8A is an explanatory schematical longitudinal sectional view, and

FIG. 8B is a cross sectional view.

DETAILED DESCRIPTION OF THE PREFERRED EMBODIMENTS

Figure 4:
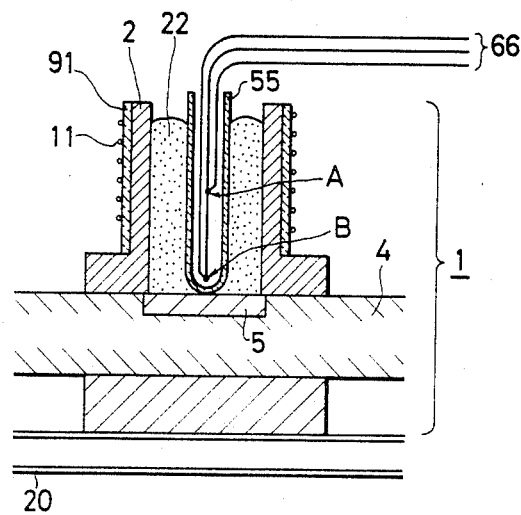
FIG. 4 is an explanatory sectional view showing the construction of the solution growth apparatus having the arrangement of the present invention and provided with means for measuring the temperature difference developed between the upper portion and the lower portion of the melt contained in a reservoir.

The basic structure of the solution growth apparatus which satisfies the essential requirements of the present invention comprises a quartz reactor tube which is not provided, exteriorly of this reactor tube, with any sub-heating means or a cooling means for causing thermal disturbance to the growth system, but which, instead, is arranged that the boat housed within the quartz reactor tube is provided with a sub-heating means and a cooling means.

A basic structure of the solution growth apparatus according to the present invention is shown in FIG. 3A and FIG. 3B.

A boat 1 is disposed within a quartz reactor tube 6 housed in a growth furnace 7 which is intended to impart a necessary temperature. As the means to develop a temperature difference in the melt, respective melt-containing reservoirs supported on the boat 1 are wound therearound, via insulators 91, 92 and 93 which are made of, for example, quartz pipes, with heating coils 11, 12 and 13, respectively, which are made of, for example, tungsten or molybdenum. A quartz pipe 20 which concurrently serves as a jig for supporting the boat 1 is arranged below the boat 1. A coolant gas such as nitrogen or argon gas is supplied under pressure through the quartz pipe 20 by the provision of, for example, three coolant supply and retrieving pipes 20a, 20b and 20c as shown in FIG. 3B which are connected to communicate at their one ends, and using the pipe 20b to serve as the inlet of the coolant gas and using the other two pipes 20a and 20c to serve as the outlets of the used gas. Thus, it is possible to easily set the thermal flow which proceeds toward the under portion of the substrate and to remove the heat thereof to the exterior side of the system.

Description will hereunder be made as to how good an efficiency can be obtained from the temperature difference system having the above-mentioned arrangement by giving reference to the result of measurement of the efficiency.

To this end, a concrete embodiment of the manner of developing a temperature difference within the melt reservoir will be shown herebelow.

FIG. 4 is a partly enlarged view of the boat 1 which is disposed in the quartz reactor tube 6 of FIG. 3, showing the structure of the means for measuring the temperature difference in the melt. A melt-containing reservoir 2 made of carbon is wound therearound with a tungsten heating coil 11 via an insulator 91 made of a quartz pipe. A Ga melt 22 is contained in said reservoir 2. Furthermore, a thermocouple 66 having two contact points is inserted into the Ga melt 22 via a quartz pipe 55. Also, below the reservoir 2, a quartz pipe 20 is arranged to run in contact with the boat 1 via a slider 4 carrying a substrate 5 thereon. A coolant gas $N_2$ is caused to flow through this quartz pipe 20, so that the heat can be taken away from the bottom of the boat 1. The above structure satisfies the basic construction of the present invention.

With the same arrangement as that shown in FIG. 3 and by using the measuring device shown in FIG. 4, vertical temperature difference in the melt is measured.

Figure 5:
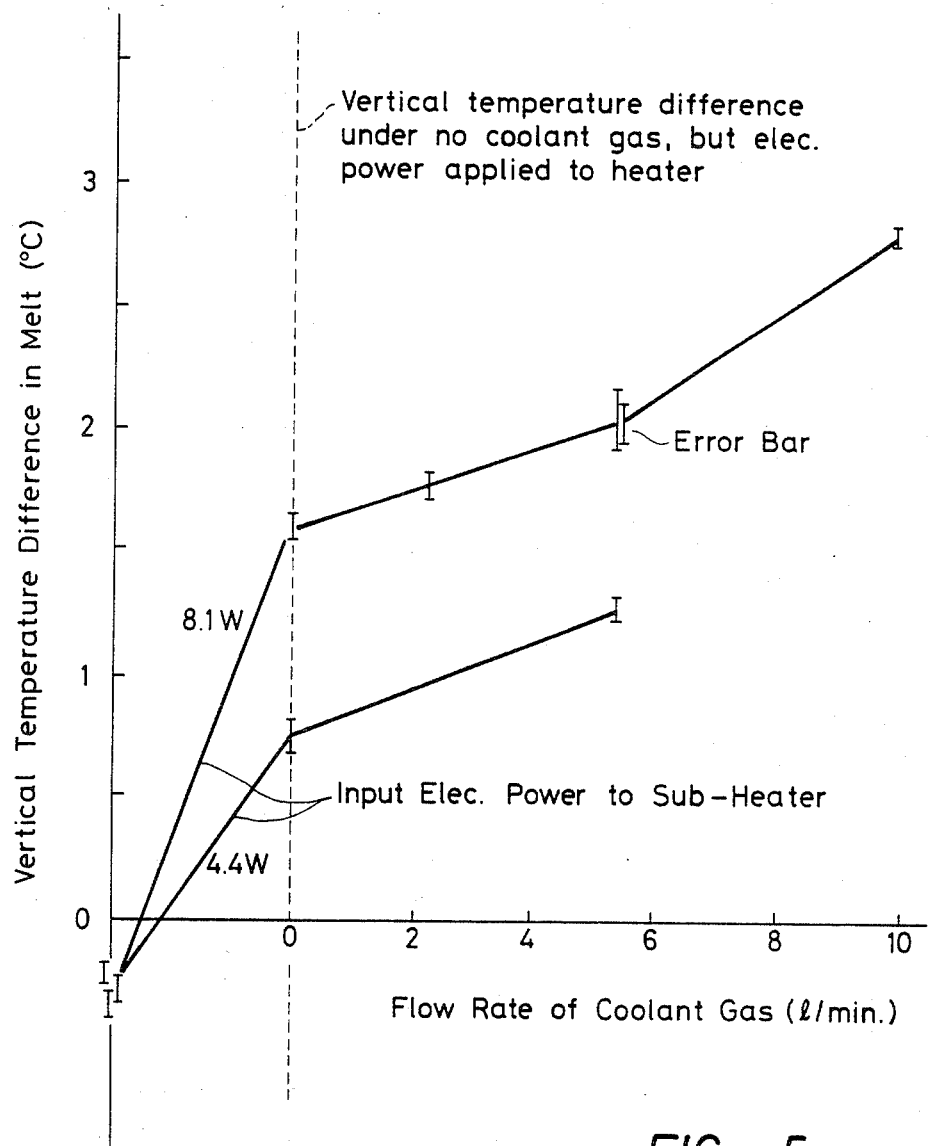
FIG. 5 is a chart showing the flow rate of a coolant gas when the input electric power applied to the sub-heating means in FIG. 4 is taken as a parameter, and also the resulting temperature difference between the upper portion and the lower portion in the melt.

FIG. 5 shows the result of the measurements of the vertical temperature difference in the Ga melt by varying the input electric power applied to the respective tungsten heating coils 11, 12 and 13, and by varying the flow rate of the coolant $N_2$ gas flowing through the quartz pipe 20 provided beneath the boat 1.

The vertical axis indicates the vertical temperature difference (°C.) of the Ga melt, and the horizontal axis indicates the flow rate (l/min.) of the coolant gas. The values of measurements indicate those of the instance wherein the input electric power applied to the sub-heating means is 4.4 W, and of the instance wherein it is 8.1 W. The vertical dotted line indicates the values of the vertical temperature difference when no coolant gas is supplied through the pipe but only an input electric power is applied to the sub-heating means. The vertical solid line indicates the values of the temperature difference which develops spontaneously only from the structure of the boat when both the sub-heating means and the cooling means are inoperative, and shows the result that the temperature of the melt located close to the substrate exhibits a temperature about 0.2°–0.3° C. higher conversely than the temperature of the melt located away from the substrate.

As the input electric power applied to the tungsten coils 11, 12 and 13 wound around the melt-containing reservoirs is augmented, the vertical temperature difference in each Ga melt increases as a matter of course. However, when no coolant gas is caused to flow, and only the sub-heating coils are applied with electric power, for example, at 8.1 W, there is exhibited a temperature difference of 1.5° C. In addition to the actuation of these sub-heating coils, when N₂ gas as the coolant gas is caused to flow through the quartz pipe 20 provided at the bottom of the boat 1, the vertical temperature difference in the Ga melt becomes further greater. For example, at 8.1 W of electric power applied to the sub-heating coils, and at the flow rate of 2.2 l/min., the value of the temperature difference extends greater by 0.2° C. as compared with the instance wherein no coolant gas is supplied.

Figure 6:
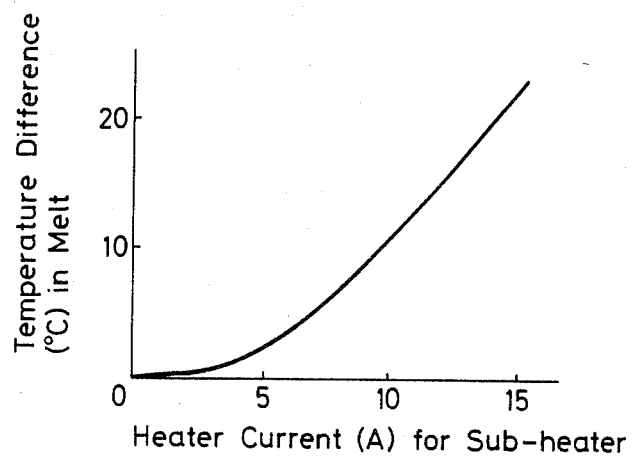
FIG. 6 is a chart showing the electric current applied to the sub-heating means for a certain value of the flow rate of the coolant gas in FIG. 4, and the resulting temperature difference developing the melt.

FIG. 6 is a chart showing the values of the vertical temperature difference in the Ga melt by varying the value of the electric power applied to the sub-heating means 11 made of a tungsten coil. This chart shows that it is possible to easily develop a vertical temperature difference in the melt by the electric power applied to the tungsten coil 11 wound, via a quartz insulator 91, around the melt-containing reservoir 2. Thus, it becomes possible to develop a temperature difference in the melt by the application of only a small heating power which is by far the smaller than the electric power used for the sub-heating means provided on the outside of the quartz reactor tube in the conventional art. Also, it is possible to let the heat away from the bottom side of the boat by supplying a small amount of coolant gas. As a result, it becomes possible to greatly suppress the thermal fluctuation in the quartz reactor which is resulted from developing a vertical temperature difference in the melt. Thus, a growth can be conducted at a much more stabilized condition than in the prior art.

Figure 7:
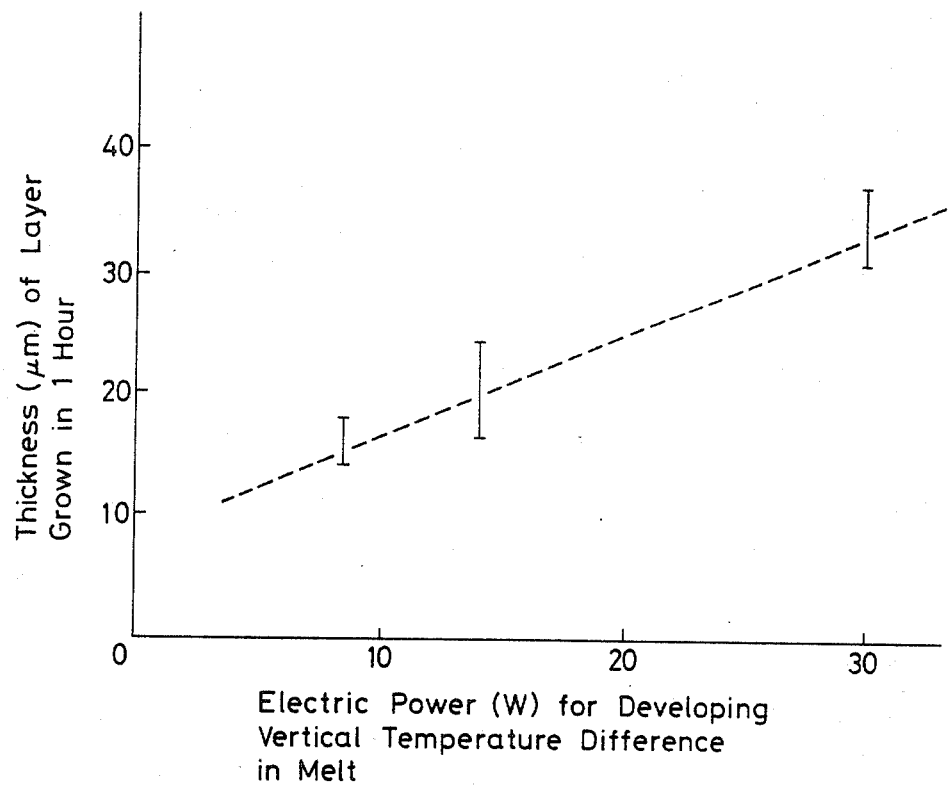
FIG. 7 is a chart showing the input electric power applied to the sub-heating means when a GaAs crystal is grown by the solution growth apparatus having the arrangement of the present invention, and the resulting growth rate.

FIG. 7 shows the relationship between the input electric power applied to the sub-heating means and the growth rate in case a GaAs crystal which is a Group III-V compound semiconductor is grown epitaxially from solution.

As will be apparent from FIGS. 5 and 7, with several watts W of the input electric power applied to the sub-heating means and with several liters/minute of the flow rate of the coolant gas, and by using the apparatus having the above-mentioned arrangement, there can be obtained a growth rate of a layer thickness of 20-30 μm/hr. When compared with the prior art methods, there can be obtained a growth rate which is several times greater than that obtained in the prior art, with an input electric power applied to the sub-heating means which is of a value close to 1/100 of the conventional value, and with a flow rate of the coolant gas which is also close to 1/100 of the flow rate in the prior art.

As discussed above, with the solution growth apparatus having the arrangement according to the present invention, it will be noted that there is obtained a very high efficiency of thermal exchange between the heating means and the cooling means which are intended to develop a required vertical temperature difference in the melt, and that accordingly, it is possible to enhance the growth rate with only a small power for heating the melt and with only a small flow rate for cooling the melt. Besides, because of the fact that the site at which a thermal flow is caused is localized within the boat, the effect of the main heating means upon temperature control becomes minimized, and thus the apparatus can sufficiently exhibit the merit or advantage of the temperature difference technique that a growth is conducted at a constant temperature. Thus, it has become clear that there is easily accomplished the growth of a defect-free grown layer. More specifically, as the present inventors have done elsewhere, in case there arises a fluctuation of temperature to an extent of about 2° to 5° C. during the growth, it has been found, from microscopical observation of the cleavage surface, that there is developed line defects in parallel with the interface between the grown layer and the substrate. In case, however, a growth is performed with the solution growth apparatus of the present invention, the development of such defects has been found to be absent in almost all the instances of growth conducted, and it has become possible to accomplish the growth of layers having a very good crystal perfection.

Figure 8A:
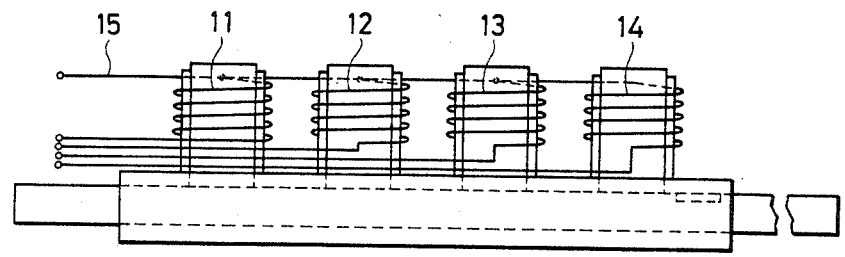
Figure 8B:
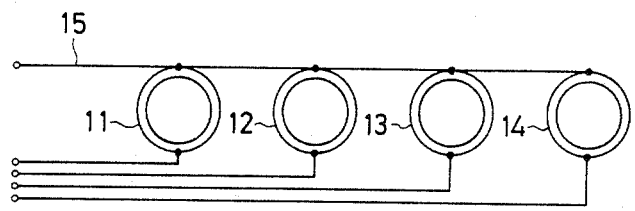

The adoption of the solution growth apparatus having the construction according to the present invention is very effective in case the solution growth for use in such semiconductor devices as mentioned below is intended to be performed on a mass production scale. More specifically, in case it is desired to obtain, on mass production basis, a solution growth for devices having multiple grown layers having different thicknesses relative to each other, it would be necessary to set equal the growth time of the respective layers. It would be necessary to control the vertical temperature difference in each batch of melt by respectively varying the vertical temperature difference which is developed in each batch of melt. Accordingly, it is very effective to form the temperature difference-causing heating means in such way that different electric powers are applied to the reservoirs respectively. Such arrangement has not been possible nor practical in the prior art methods, but this becomes sufficiently possible in the present invention. For example, as shown in FIGS. 8A and 8B, in case of four reservoirs, instead of deriving eight lead wires as in the prior art from both ends of the respective four coils for the respective reservoirs, one of the ends of the respective four coils are connected in common as indicated at 15, and the other ends are used to derive four lead wires 11, 12, 13 and 14 separately from each other, with a total of five lead wires which are derived to the outside of the growth furnace. According to the experiments done by the inventors, the heating coils which are wound around the melt-containing reservoirs are tungsten wires having a diameter of 0.6 to 1.0 mm, and the lead wires derived to the outside of the growth furnace, desirably, are made of molybdenum wires having a diameter of 1.0 to 2.0 mm.

For the electrical insulation between the respective wires or for the electrical insulation from the carbon boat, there may be used an insulator made of, for example, a narrow quartz tube or an $Al_2O_3$ insulator.

As explained above, the present invention is such that, in a solution growth apparatus adopting the temperature difference technique, the development of a vertical temperature difference in the melt contained in a reservoir is accomplished by the provision of a sub-heating means and a cooling means which are locally arranged in the vicinity of the melt, and the thermal exchange efficiency at such site is enhanced thereby, and a growth is conducted with a small electric power for the sub-heating means and with a small flow rate of the coolant, and thus the present invention provides a solution growth apparatus which extremely suppresses the thermal fluctuation of the main heating means.

Figure 9:
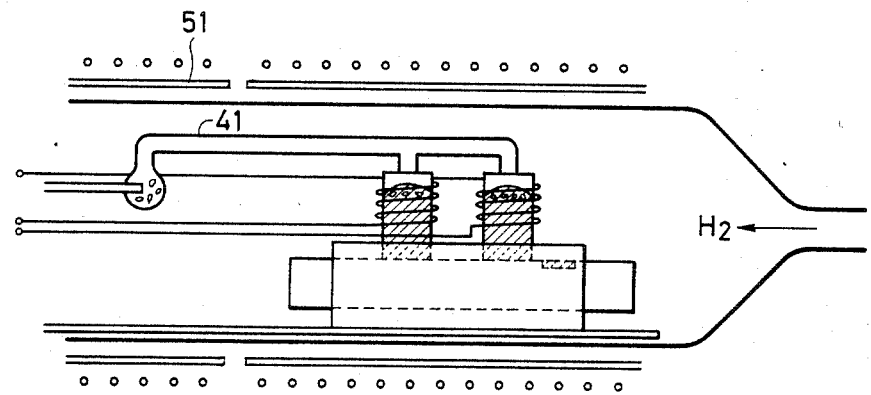
FIG. 9 is an embodiment of the solution growth apparatus according to the present invention relying on the temperature difference technique and adopting a vapor pressure control system. For the convenience of explanation, like parts are indicated by like reference numerals throughout the drawing.

Furthermore, in case a solution growth is conducted under the vapor pressure of one of the constituent elements of the compound semiconductor material having a higher vapor pressure over the other, it is possible to greatly reduce the deviation of the grown layer from the stoichiometrical composition, and also the crystal perfection is improved further, and this has been proposed already by Jun-ichi NISHIZAWA, one of the present inventors, see U.S. Pat. No. 4,315,796 issued Feb. 16, 1982. Even in such instance also, it can be readily anticipated that a solution growth apparatus added with a pipe intended for the control of such vapor pressure as shown in FIG. 9 can branch out from the present invention without departing from the spirit and scope of the present invention.

More specifically, in case it is intended to grow a GaAs crystal with an apparatus having the same construction as that shown in FIG. 3 (for the convenience of explanation, the number of the reservoirs is designated here as two), it will be noted that As which is a Group V element has a higher vapor pressure over the other constituent element, so that in order to compensate for its vaporization into the melt or the solution during the growth process, there is inserted, into the melt from above of each growth reservoir, a vapor pressure control pipe 41 made of, for example, quartz containing the metal As, and the temperature of the As-containing region of the system is controlled by a vapor pressure controlling furnace 51 which is separate from the growth furnace 7. Under an optimum As pressure, there is obtained a dislocation-free, defect-free epitaxial growth layer.

It will be appreciated that the present invention can be applied equally effectively to solution growth apparatuses for any kinds of semiconductor crystals, so long as it is intended to conduct a solution growth by relying on the above-mentioned type of temperature difference technique.

What is claimed is:

1. An apparatus for performing an epitaxial growth of a compound semiconductor from solution using a temperature difference technique, comprising:
   reactor means having external furnace means;
   boat means housed in said reactor means;
   at least one reservoir means for containing a melt and carried on said boat means within said reactor means;
   electrical insulation means disposed around said reservoir;
   heating means provided within said reactor means directly disposed around said insulation means to heat said melt; and
   a plurality of quartz cooling tubes provided at the bottom of said boat means within said reactor means for conveying a coolant gas for developing a uniform vertical temperature difference in said melt mainly by thermal exchange between said heating means and cooling tubes while effectively suppressing thermal fluctuation in the melt from said furnace means.

2. An apparatus according to claim 1, in which:
   said reactor means is a quartz tube.

3. An apparatus according to claim 1, in which:
   said heating means is a heating coil wound around said reservoir to be supplied with an electric power.

4. An apparatus according to claim 1, in which:
   said reservoir is provided in plural number, and
   said heating means is arranged so as to develop a uniform vertical temperature difference in the melt contained in each of the reservoirs.

5. An apparatus according to claim 1, in which:
   said reservoir is provided in plural number, and
   said heating means is arranged so as to develop different vertical temperature differences in respective batches of melt contained in the plural reservoirs.

6. An apparatus according to claim 1 further comprising:
   vapor pressure controlling means for supplying, onto the melt contained in said reservoir, vapor of one of constituent elements of a compound semiconductor to be grown into a crystal.

7. An apparatus according to claim 4, further comprising:
   vapor pressure controlling means for supplying, to batches of melt contained in the plural reservoirs, vapor of one of constituent elements of a compound semiconductor to be grown into a crystal.

8. An apparatus according to claim 5, further comprising:
   independent vapor pressure controlling means for independently supplying,
   to batches of melt contained in the plural reservoirs, vapor of one of constituent elements of a compound semiconductor to be grown into a crystal.

9. An apparatus according to claim 1, in which:
   said compound semiconductor is one selected from the group consisting of Group III-V compound semiconductors and Group II-VI compound semiconductors.

10. An apparatus according to claim 1 including growth furnace means exteriorally of said reactor means for imparting to said melt, in conjunction with said heating means, a temperature necessary for said epitaxial growth.

* * * * *